United States Patent
Park et al.

(10) Patent No.: US 8,601,353 B2
(45) Date of Patent: Dec. 3, 2013

(54) APPARATUS AND METHOD FOR TRANSMITTING DATA USING REPEAT ACCUMULATE CODING SCHEME IN COMMUNICATION SYSTEM

(75) Inventors: Sung-Ik Park, Daejeon (KR); Hyoungsoo Lim, Daejeon (KR); Jae-Hyun Seo, Daejeon (KR); Ho-Min Eum, Daejeon (KR); Heung-Mook Kim, Daejeon (KR); Donghoon Kang, Daejeon (KR); Wangrok Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 564 days.

(21) Appl. No.: 12/893,852

(22) Filed: Sep. 29, 2010

(65) Prior Publication Data
US 2011/0107189 A1    May 5, 2011

(30) Foreign Application Priority Data

May 31, 2011 (KR) .................. 10-2010-0051403
Oct. 30, 1920 (KR) .................. 10-2009-0104634

(51) Int. Cl.
*H03M 13/03* (2006.01)
*H03M 13/00* (2006.01)

(52) U.S. Cl.
USPC ............................ 714/790; 714/752; 714/758

(58) Field of Classification Search
None
See application file for complete search history.

(56) References Cited

U.S. PATENT DOCUMENTS

| | | | | |
|---|---|---|---|---|
| 8,261,153 | B2 * | 9/2012 | Chugg et al. | 714/758 |
| 2005/0111564 | A1 * | 5/2005 | Kramer et al. | 375/265 |
| 2005/0160349 | A1 | 7/2005 | Cheun et al. | |
| 2006/0294445 | A1 * | 12/2006 | Divsalar et al. | 714/752 |
| 2007/0260772 | A1 * | 11/2007 | Garmonov et al. | 710/33 |
| 2010/0125764 | A1 * | 5/2010 | Kose | 714/704 |

FOREIGN PATENT DOCUMENTS

KR    20050065790 A    6/2005

* cited by examiner

*Primary Examiner* — Shelly A Chase
*Assistant Examiner* — Justin R Knapp
(74) *Attorney, Agent, or Firm* — Rabin & Berdo, P.C.

(57) ABSTRACT

An apparatus for transmitting data in a communication system includes: a first repeater configured to repeat information bits of data to be transmitted a first repetition number of times; an interleaver configured to interleave the information bits repeated the first repetition number of times; an accumulator configured to accumulate-code the interleaved information bits; a second repeater configured to repeat the accumulate-coded information bits a second repetition number of times; a puncturer configured to puncture the information bits repeated the second repetition number of times; and a P/S converter configured to convert the punctured information bits and the information bits of the data and output RA-coded information bits.

20 Claims, 2 Drawing Sheets

APPARATUS AND METHOD FOR TRANSMITTING DATA USING REPEAT ACCUMULATE CODING SCHEME IN COMMUNICATION SYSTEM

CROSS-REFERENCES TO RELATED APPLICATIONS

The present application claims priority of Korean Patent Application Nos. 10-2009-0104634 and 10-2010-0051403, filed on Oct. 30, 2009, and May 31, 2010, respectively, which are incorporated herein by reference in their entirety.

BACKGROUND OF THE INVENTION

1. Field of the Invention

Exemplary embodiments of the present invention relate to a communication system; and, more particularly, to an apparatus and a method for transmitting data using a Repeat Accumulate (RA) coding scheme in a communication system.

2. Description of Related Art

Intensive study has been performed to provide users with services having high transmission rates and various levels of Quality of Service (QoS) in the next-generation communication system. Specifically, various data coding schemes have been proposed to transmit various types of a large amount of data at a high rate using limited resources in the next-generation communication system, and those schemes should support various coding rates.

A Forward Error Correction (FEC) coding scheme has been proposed as an exemplary coding scheme for supporting various coding rates during high-rate transmission of a large amount of data in a communication system, and a RA coding scheme has been proposed as an example of the FEC coding scheme. The RA coding scheme provides good performance and code gain using a RA coder of a relatively simple structure, and is widely used for data transmission. According to the RA coding scheme, the number of repetition can be increased, during RA coding of data to be transmitted, so as to generate a RA code having a low coding rate.

However, the above-mentioned RA coding scheme has a problem in that, when a RA code having a low coding rate is generated during data transmission using the RA coding scheme, the performance degrades at a low coding rate, e.g. at a coding rate of ⅙ or less. In other words, when data is transmitted using the currently proposed RA coding scheme, the Bit Error Rate (BER) of the transmitted data increases abruptly as the coding rate decreases, specifically at a coding rate of ⅙ or less. As a result, during high-rate transmission of a large amount of data at a low coding rate using the RA coding scheme, the amount of data transmitted normally decreases rapidly, which means that the amount of data to be retransmitted increases (i.e. data transmission rate decreases), finally degrading the system performance.

Therefore, there is a need for a scheme for transmitting data using the RA coding scheme in a communication system without exhibiting performance degradation either in a high coding rate or in a low coding rate.

SUMMARY OF THE INVENTION

An embodiment of the present invention is directed to an apparatus and a method for transmitting data in a communication system.

Another embodiment of the present invention is directed to an apparatus and a method for transmitting data using a RA coding scheme in a communication system.

Another embodiment of the present invention is directed to an apparatus and a method for transmitting data using a RA coding scheme in a communication system without performance degradation even at a low coding rate.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, an apparatus for transmitting data in a communication system includes: a first repeater configured to repeat information bits of data to be transmitted a first repetition number of times; an interleaver configured to interleave the information bits repeated the first repetition number of times; an accumulator configured to accumulate-code the interleaved information bits; a second repeater configured to repeat the accumulate-coded information bits a second repetition number of times; a puncturer configured to puncture the information bits repeated the second repetition number of times; and a P/S converter configured to convert the punctured information bits and the information bits of the data and output RA-coded information bits.

In accordance with another embodiment of the present invention, an apparatus for transmitting data in a communication system includes: a coder configured to perform first repetition and second repetition of information bits of data to be transmitted in conformity with a coding rate and puncture the repeated information bits to generate RA-coded information bits, wherein the coder is configured to determine the repetition numbers for the first and second repetitions and the number of punctured information bits in conformity with the coding rate.

In accordance with another embodiment of the present invention, a method for transmitting data in a communication system includes: performing first repetition of information bits of data to be transmitted a predetermined repetition number of times; interleaving the first-repeated information bits; accumulate-coding the interleaved information bits; performing second repetition of the accumulate-coded information bits a predetermined repetition number of times; and puncturing the second-repeated information bits and converting the punctured information bits to generate a RA-coded information bits.

DESCRIPTION OF SPECIFIC EMBODIMENTS

Figure 1:
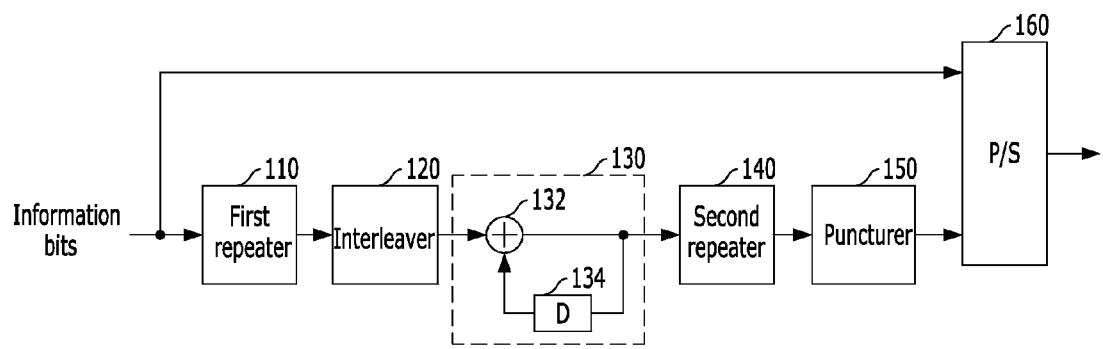
FIG. 1 illustrates the schematic structure of a coder of an apparatus for transmitting data in a communication system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present invention proposes an apparatus and a method for transmitting data rapidly and normally in a communication system. In accordance with an embodiment of the present invention, a RA coding scheme is used in a communication system to transmit a large amount of data normally at a high rate without performance degradation at any coding rate. Although it will be assumed in the following description of exemplary embodiments of the present invention that a RA coding scheme is used to transmit data in a communication system, the apparatus and method for transmitting data proposed by the present invention can not only be applied to FEC coding schemes including the above-mentioned RA coding scheme, but also to other coding schemes.

In accordance with an embodiment of the present invention, furthermore, a large amount of data is transmitted at a high rate using a coder which uses a RA coding scheme and has a simple structure, and various coding rates are supported. Data transmission error, specifically the BER of transmitted data, is minimized at any coding rate, e.g. at a low coding rate of 1/6 or less, to guarantee normal data transmission. Consequently, stable data transmission performance is acquired at any coding rate, the data transmission rate is increased, and system performance is improved. An apparatus for transmitting data in a communication system in accordance with an embodiment of the present invention will now be described in more detail with reference to FIG. 1.

FIG. 1 illustrates the schematic structure of a coder of an apparatus for transmitting data in a communication system in accordance with an embodiment of the present invention. Specifically, FIG. 1 illustrates the schematic structure of a coder configured to code information bits of data to be transmitted according to a RA coding scheme.

Referring to FIG. 1, the apparatus for transmitting data includes a coder configured to perform coding according to a RA coding scheme. The coder includes a first repeater 110 configured to repeat information bits of data to be transmitted to a receiver a predetermined number (q) of times; an interleaver 120 configured to interleave the information bits repeated q times by the first repeater 110; an accumulator 130 configured to accumulate the information bits interleaved by the interleaver 120; a second repeater 140 configured to repeat the information bits accumulated by the accumulator 130 a predetermined number (n) of times; a puncturer 150 configured to puncture the information bits repeated n times by the second repeater 140; and a Parallel/Serial (P/S) converter 160 configured to convert the information bits inputted to the first repeater 110 and the information bits punctured by the puncturer 150 into serial-type information bits and output the serial-type information bits.

The first repeater 110 is configured to receive information bits of data to be transmitted to the receiver, repeat the received information bits q times, and output the q-times repeated information bits to the interleaver 120. When the information bits of data to be transmitted to the receiver have a length of N, the information bits of length N are inputted to the first repeater 110 and to the P/S converter 160. The first repeater 110 receives the information bits of length N, performs repetition q times so that the information bits of length N are repeated q times, and outputs the repeated information bits to the interleaver 120. The information bits repeated q times and outputted to the interleaver 120 have a length of qN.

The number (q) of repetition by the first repeater 110, i.e. the number (q) of first repetition when the coder is to code inputted information bits according to a RA coding scheme, is determined in conformity with the coding rate applied when the transmitting apparatus codes and transmits data according to the RA coding scheme. The number (n) of repetition by the second repeater 140 (described later), i.e. the number (n) of second repetition when the coder is to code inputted information bits according to the RA coding scheme, is determined in conformity with the coding rate applied when the transmitting apparatus codes and transmits data according to the RA coding scheme.

To be more specific, the number (q) of repetition by the first repeater 110 and the number (n) of repetition by the second repeater 140 are determined in conformity with a coding rate applied when the transmitting apparatus codes and transmits data according to the RA coding scheme. For example, when the coding rate is 1/10, the repetition number (q) for the first repetition may be 5, and the repetition number (n) for the second repetition may be 2. That is, the transmitting apparatus in accordance with an embodiment of the present invention, when transmitting data to the receiver at a predetermined coding rate using the RA coding rate, determines the repetition numbers (q and n) for first and second repetitions in conformity with the coding rate, performs first repetition of information bits to be transmitted q times, and performs second repetition of the information bits, which have been repeated q times, n times.

Those skilled in the art can understand that more repetitions than the above-mentioned first and second repetitions may be performed predetermined numbers of times, respectively, in conformity with the predetermined coding rate, but third repetition or more require an increased number of repeaters and slow down data transmission performance improvement. Considering this, in accordance with an embodiment of the present invention, first and second repetitions are performed q and n times, respectively, in conformity with the predetermined coding rate. For example, first repetition of information bits may be performed x times in conformity with the predetermined coding rate, second repetition of the x-times repeated information bits may be performed y times, and third repetition of the y-times repeated information bits may be performed z times, but such first to third repetitions for RA coding of data increase the number of repeaters for performing the above-mentioned numbers of first to third repetitions, respectively. Furthermore, data transmission performance does not improve in proportion to the increase of repeaters. Therefore, first and second repetitions are performed q and n times, respectively, in conformity with the predetermined coding rate.

The interleaver 120 is configured to receive information bits of length N, which have been repeated q times and outputted from the first repeater 110 (i.e. information bits of length qN), interleave the received information bits, and output the interleaved information bits to the accumulator 130. The information bits interleaved and outputted to the accumulator 130 have a length of qN.

The accumulator 130, which is implemented with an accumulator having a coding rate of 1, is configured to accumulate the interleaved information bits outputted from the interleaver 120 and output the accumulated information bits to the second repeater 140. The accumulator 130 includes an adder 132 configured to receive the interleaved information bits outputted from the interleaver 120 and a delay unit 134 configured to delay the accumulated information bits outputted from the adder 132 as output bits of the accumulator 130.

The adder 132 is configured to receive currently interleaved information bits outputted from the interleaver 120 and accumulated information bits outputted from the delay unit 134 and subject the two types of inputted information bits, i.e. interleaved information bits and accumulated information bits, to a predetermined operation, e.g. modulo-2 addition operation. More specifically, the adder 132 compares interleaved information bits outputted from the interleaver 120 with delayed information bits outputted from the delay unit 134, outputs 0 when the compared bit values are the same, and outputs 1 when the compared bit values are different. Consequently, the adder 132 outputs accumulate-coded information bits to the second repeater 140 as an input of the accumulator 130, and the accumulate-coded information bits are delayed by the delay unit 134 and used for the above-mentioned accumulate coding when the next interleaved information bits are inputted.

The delay unit 134 is configured to delay the accumulate-coded information bits outputted from the adder 132 as an input of the accumulator 130 and output the accumulate-coded information bits to the adder 132 so that, when the next interleaved information bits are inputted from the interleaver 120 to the adder 132, the adder 132 accumulate-codes the next interleaved information bits using the accumulate-coded information bits. Information bits of length N inputted to the coder go through the first repeater 110, the interleaver 120, and the accumulator 130 and become regular RA-coded information bits, which are inputted to the second repeater 140 as an output of the adder 132. The regular RA-coded information bits outputted to the second repeater 140 have a length of qN. The coder includes a first coder configured to receive information bits of data to be transmitted to the receiver and generate regular RA-coded information bits. The first coder includes the first repeater 110, the interleaver 120, and the accumulator 130.

The second repeater 140 is configured to receive information bits, which have been accumulate-coded into regular RA-coded information bits, from the adder 132 of the accumulator 130, repeat the inputted information bits n times, and output the n-times repeated information bits to the puncturer 150. The second repeater 140 is configured to receive regular RA-coded information bits having a length of qN, perform repetition n times so that the regular RA-coded information bits of length qN are repeated n times, and output the repeated information bits to the puncturer 150. The information bits repeated n times and outputted to the puncturer 150 have a length of nqN.

The number (n) of repetition by the second repeater 140 is determined in conformity with the coding rate applied when the transmitting apparatus codes and transmits data according to the RA coding scheme, as has already been described in detail, and repeated description thereof will be omitted herein.

The puncturer 150 is configured to receive information bits repeated n times and outputted from the second repeater 140, puncture one of p information bits from the n-times repeated information bits, and output the punctured information bits to the P/S converter 160. Specifically, the puncturer 150 punctures one of p information bits from information bits having a length of nqN in conformity with the coding rate. The number (p) of information bits, one of which is punctured, is determined in conformity with the coding rate applied when the transmitting apparatus codes and transmits data according to the RA coding scheme, as in the case of the above-mentioned repetition numbers (q and n) for the first and second repetitions. The repetition numbers (q and n) for the first and second repetitions, which conform to the coding rate, and the number (p) of information bits from inputted information bits, one of which is punctured by the puncturer 150 in conformity with the coding rate, have a relationship defined by Equation 1 below.

$$r = \frac{N}{N + nqN\left(1 - \frac{1}{p}\right)} \qquad \text{Eq (1)}$$

In Equation 1 above, r refers to the coding rate. For example, when the length N of information bits of data to be transmitted to the receiver is 6144 and the coding rate r is $\frac{1}{10}$, the repetition number q for the first repetition may be 5, the repetition number n for the second repetition may be 2, and the number p of information bits, one of which is punctured, may be 10.

The puncturer 150 is configured to puncture one of p information bits from information bits having a length of nqN and output the punctured information bits to the P/S converter 160. The information bits outputted to the P/S converter 160 become irregular RA-coded information bits. In other words, the regular RA-coded information bits, which are accumulate-coded information bits outputted from the accumulator 130, go through the second repeater 140 and the puncturer 150 and become the irregular RA-coded information bits, which are inputted to the P/S converter 160. The coder includes a second coder configured to receive regular RA-coded information bits generated by the first coder and generate irregular RA-coded information bits. The second coder includes the second repeater 140 and the puncturer 150.

The P/S converter 160 is configured to receive the irregular RA-coded information bits from the puncturer 150 and receive information bits of length N inputted to the first repeater 110. The P/S converter 160 is configured to convert the inputted parallel-type irregular RA-coded information bits and length-N information bits into serial-type information bits and output final information bits coded according to the RA coding scheme. As such, the apparatus for transmitting data codes information bits of data to be transmitted to the receiver according to the RA coding scheme through the first repeater 110, the interleaver 120, the accumulator 130, the second repeater 140, the puncturer 150, and the P/S converter 160, and transmits the RA scheme-coded data to the receiver.

In summary, the apparatus for transmitting data in accordance with an embodiment of the present invention operates as follows: The coder, which is configured to perform coding according to a RA coding scheme, performs first repetition of information bits of data to be transmitted and interleaves and accumulates the information bits to perform regular RA coding. The coder performs second repetition of the regular RA-coded information bits and punctures the information bits to perform irregular RA coding. The resulting RA coding acquires stable data transmission performance at any coding rate. In other words, the apparatus for transmitting data in accordance with an embodiment of the present invention, based on the above-mentioned RA coding, minimizes data transmission errors and improves data transmission performance. The data transmission performance of the apparatus for transmitting data in a communication system in accordance with an embodiment of the present invention will now be described in more detail with reference to FIG. 2.

Figure 2:
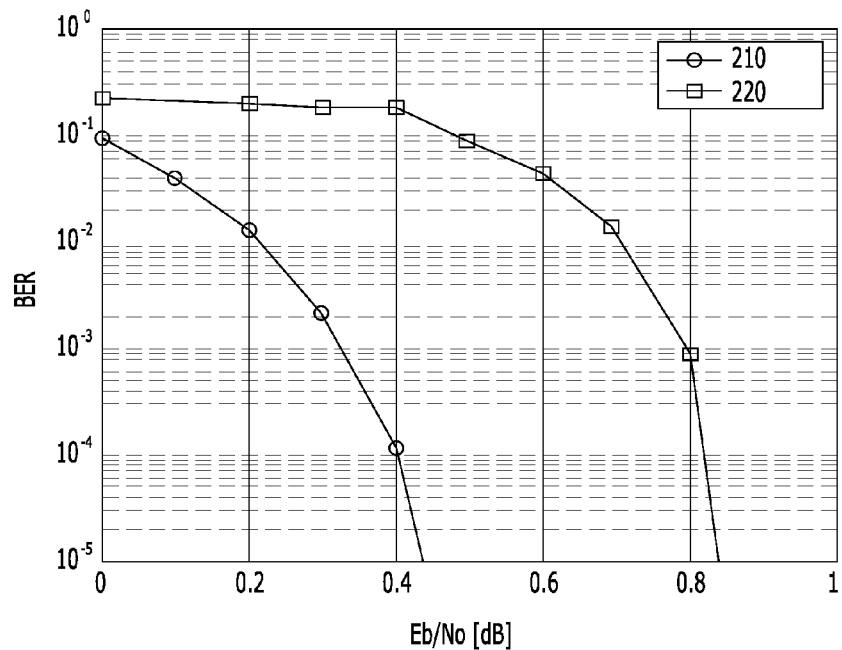
FIG. 2 illustrates the data transmission performance of an apparatus for transmitting data in a communication system in accordance with an embodiment of the present invention.

FIG. 2 illustrates the data transmission performance of an apparatus for transmitting data in a communication system in accordance with an embodiment of the present invention.

It is clear from FIG. 2 that data transmission performance 210 of the apparatus for transmitting data, when information bits of data to be transmitted to the receiver are subjected to the above-mentioned RA coding in accordance with an embodiment of the present invention, is superior to data transmission performance 220 when RA coding is performed according to the conventional scheme. Specifically, the data transmission performance 210 when RA coding is performed in accordance with an embodiment of the present invention corresponds to a case when the repetition number (q) for the first repetition is 5 and the repetition number (n) for the second repetition is 2, and the data transmission performance 220 when RA coding is performed according to the conventional scheme corresponds to a case when the repetition number for first repetition is 10. The RA coding operation by an apparatus for transmitting data in a communication system in accordance with an embodiment of the present invention will now be described in more detail with reference to FIG. 3.

Figure 3:
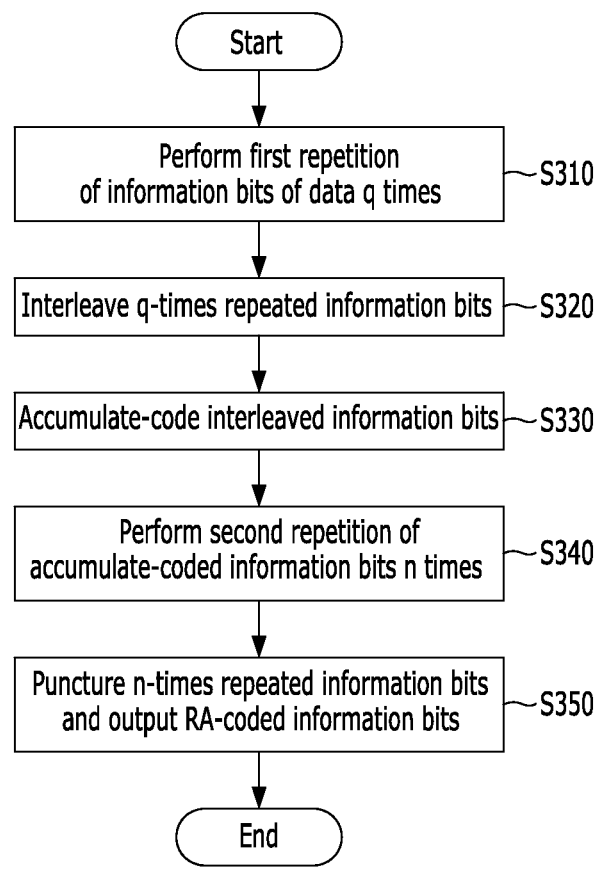
FIG. 3 illustrates a schematic operating process of an apparatus for transmitting data in a communication system in accordance with an embodiment of the present invention.

FIG. 3 illustrates a schematic operating process of an apparatus for transmitting data in a communication system in accordance with an embodiment of the present invention. Specifically, FIG. 3 illustrates a schematic operating process of a coder configured to code information bits of data to be transmitted according to a RA coding scheme.

Referring to FIG. 3, the data transmission apparatus performs first repetition of information bits of data to be transmitted to the receiver a repetition number (q) of times determined in conformity with the coding rate at step S310. The repetition number (q) for the first repetition is determined in conformity with the coding rate applied when data is transmitted by the data transmission apparatus, as described above. When information bits of data to be transmitted to the receiver have a length of N, the information bits repeated q times have a length of qN.

The data transmission apparatus interleaves the q-times repeated information bits at step S320. The data transmission apparatus accumulates the interleaved information bits to generate accumulate-coded information bits at step S330. The interleaved information bits, together with previously accumulate-coded and delayed information bits, undergo a predetermined operation, specifically modulo-2 addition operation. The information bits, after this operation, become accumulate-coded information bits. The accumulate coded information bits are delayed to undergo the above-mentioned operation together with the next interleaved information bits. Generation of the accumulate-coded information bits means generation of regular RA-coded information bits.

The data transmission apparatus performs second repetition of the accumulate-coded information bits, i.e. regular RA-coded information bits, a repetition number (n) of times determined in conformity with the coding rate at step S340. The repetition number (n) for the second repetition is determined in conformity with the coding rate applied when data is transmitted by the data transmission apparatus, as described above. When the accumulated information bits have a length of qN, the information bits repeated n times have a length of nqN. For example, when the coding rate is 1/10, the repetition number (q) for the first repetition is 5, and the repetition number (n) for the second repetition is 2.

The data transmission apparatus punctures one of p information bits of the n-times repeated information bits to generate irregular RA-coded information bits, converts the irregular RA-coded information bits and information bits of data to be transmitted to the receiver into serial-type information bits, and outputs final RA-coded information bits at step S350. The irregular RA-coded information bits and the information bits of data to be transmitted to the receiver are parallel-type information bits, and the parallel-type irregular RA-coded information bits and the information bits of data to be transmitted to the receiver are converted into serial-type RA-coded information bits. The serial-type RA-coded information bits are subjected to predetermined processing and transmitted to the receiver.

The number (p) of information bits, one of which is punctured, from the n-times repeated information bits, as in the case of the above-mentioned repetition numbers (q and n) for the first and second repetitions, is determined in conformity with the coding rate applied when data is transmitted by the data transmission apparatus. The number (p) of information bits, one of which is punctured, from the n-times repeated information bits, the repetition number (q) for the first repetition, the repetition number (n) for the second repetition, and the coding rate have a relationship defined by Equation 1 given above. For example, when the length N of information bits of data to be transmitted to the receiver is 6144 and the coding rate r is 1/10, the repetition number q for the first repetition may be 5, the repetition number n for the second repetition may be 2, and the number p of information bits, one of which is punctured, may be 10.

As such, in accordance with an embodiment of the present invention, information bits of data to be transmitted to the receiver undergo first repetition, interleaving, and accumulate coding and become regular RA-coded information bits. Then, the regular RA-coded information bits undergo second repetition and puncturing and become irregular RA-coded information bits. Through this operation, the information bits of data to be transmitted to the receiver are RA-coded. Through the above-mentioned RA coding, furthermore, stable data transmission performance is acquired at any coding rate, and the data transmission rate is increased.

In accordance with the exemplary embodiments of the present invention, data is transmitted using a RA coding scheme in a communication system without performance degradation even at a low coding rate, so that a large amount of data is transmitted at a high rate. Furthermore, errors of data transmission are minimized to guarantee normal data transmission, thereby increasing the data transmission rate. Therefore, stable data transmission performance is secured at any coding rate when a RA coding scheme is used in a communication system. In addition, use of the RA coding scheme simplifies the structure of the coder, increases the data transmission rate, and improves system performance.

While the present invention has been described with respect to the specific embodiments, it will be apparent to those skilled in the art that various changes and modifications may be made without departing from the spirit and scope of the invention as defined in the following claims.

What is claimed is:

1. An apparatus for transmitting data in a communication system, comprising:
   a first repeater configured to repeat information bits of data to be transmitted a first repetition number of times;
   an interleaver configured to interleave the information bits repeated the first repetition number of times;
   an accumulator configured to accumulate-code the interleaved information bits;
   a second repeater configured to repeat the accumulate-coded information bits a second repetition number of times;
   a puncturer configured to puncture the information bits repeated the second repetition number of times; and a Parallel/Serial (P/S) converter configured to convert the punctured information bits and the information bits of the data and output Repeat Accumulate (RA)-coded information bits.

2. The apparatus of claim 1, wherein the puncturer is configured to puncture one of a predetermined number of information bits from the information bits repeated the second repetition number of times.

3. The apparatus of claim 2, wherein the first repetition number, the second repetition number, and the predetermined number are determined in conformity with a coding rate applied to the information bits of the data.

4. The apparatus of claim 1, wherein the accumulator comprises:
a delay unit configured to delay the accumulate-coded information bits; and
an adder configured to add the delayed accumulate-coded information bits and the interleaved information bits and output the accumulate-coded information bits.

5. The apparatus of claim 4, wherein the adder is configured to perform modulo-2 addition operation of the delayed accumulate-coded information bits and the interleaved information bits.

6. The apparatus of claim 4, wherein the adder is configured to output regular RA-coded information bits as the accumulate-coded information bits, and the puncturer is configured to output irregular RA-coded information bits as the punctured information bits.

7. The apparatus of claim 1, wherein
the information bits of the data and the punctured information bits are of a parallel type; and
the P/S converter is configured to convert the information bits of the data and the punctured information bits into the Repeat Accumulate (RA)-coded information bits of a serial type.

8. An apparatus for transmitting data in a communication system, comprising:
a coder configured to perform concatenate first and second repetitions on information bits of data to be transmitted in conformity with a coding rate, and to puncture the twice-repeated information bits to generate Repeat Accumulate (RA)-coded information bits, wherein
the coder is configured to determine numbers of repetition for the first and second repetitions and a number of the punctured information bits in conformity with the coding rate.

9. An apparatus of for transmitting data in a communication system, comprising:
a coder configured to perform first and second repetitions on information bits of data to be transmitted in conformity with a coding rate, and to puncture the twice-repeated information bits to generate Repeat Accumulate (RA)-coded information bits, wherein
the coder is configured to determine numbers of repetition for the first and second repetitions and a number of the punctured information bits in conformity with the coding rate; and
the coder includes
a first coder configured to perform the first repetition of the information bits of the data, interleave the repeated information bits, and accumulate-code the interleaved information bits to generate regular RA-coded information bits; and
a second coder configured to perform the second repetition of the regular RA-coded information bits and puncture the second-repeated information bits to generate irregular RA-coded information bits.

10. The apparatus of claim 9, wherein the first coder comprises:
a first repeater configured to perform the first repetition of the information bits of the data a predetermined repetition number of times;
an interleaver configured to interleave the first-repeated information bits; and
an accumulator configured to accumulate-code the interleaved information bits and output the regular RA-coded information bits.

11. The apparatus of claim 10, wherein the accumulator comprises:
a delay unit configured to delay the regular RA-coded information bits; and
an adder configured to add the delayed regular RA-coded information bits and the interleaved information bits and output the regular RA-coded information bits.

12. The apparatus of claim 11, wherein the adder is configured to perform modulo-2 addition operation of the delayed regular RA-coded information bits and the interleaved information bits.

13. The apparatus of claim 9, wherein the second coder comprises:
a second repeater configured to perform the second repetition of the regular RA-coded information bits a predetermined repetition number of times; and
a puncturer configured to puncture one of a predetermined number of information bits from the second-repeated information bits and output the irregular RA-coded information bits.

14. The apparatus of claim 9, wherein the coder comprises:
a P/S converter configured to serial-convert the irregular RA-coded information and the information bits of the data of parallel type and output the RA-coded information bits of serial type.

15. A method for transmitting data in a communication system, comprising:
performing first repetition of information bits of data to be transmitted a predetermined repetition number of times;
interleaving the first-repeated information bits;
accumulate-coding the interleaved information bits;
performing second repetition of the accumulate-coded information bits a predetermined repetition number of times; and
puncturing the second-repeated information bits and converting the punctured information bits to generate a Repeat Accumulate (RA)-coded information bits.

16. The method of claim 15, wherein in said puncturing the second-repeated information bits and converting the punctured information bits to generate a RA-coded information bits,
one of a predetermined number of information bits from the second-repeated information bits is punctured to generate irregular RA-coded information bits.

17. The method of claim 16, wherein in said puncturing the second-repeated information bits and converting the punctured information bits to generate a RA-coded information bits,
the irregular RA-coded information bits and the information bits of the data are of a parallel type, and
the RA-coded information bits are of a serial type.

18. The method of claim 16, wherein the repetition numbers for the first and second repetitions and the predetermined number are determined in conformity with a coding rate applied to the information bits of the data.

19. The method of claim 15, wherein said accumulate-coding the interleaved information bits comprises:

delaying the accumulate-coded information bits; and adding the interleaved information bits and the delayed accumulate-coded information bits to generate regular RA-coded information bits.

20. The method of claim 19, wherein in said adding the interleaved information bits and the delayed accumulate-coded information bits to generate regular RA-coded information bits, modulo-2 addition operation of the delayed accumulate-coded information bits and the interleaved information bits is performed.

* * * * *